United States Patent
Hassan et al.

(10) Patent No.: US 12,081,239 B2
(45) Date of Patent: Sep. 3, 2024

(54) MULTIUSER DECODING USING ITERATIVE DECODERS

(71) Applicant: Microsoft Technology Licensing, LLC, Redmond, WA (US)

(72) Inventors: Amer Aref Hassan, Kirkland, WA (US); David Anthony Lickorish, Sammamish, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 18/079,656

(22) Filed: Dec. 12, 2022

(65) Prior Publication Data

US 2024/0195437 A1    Jun. 13, 2024

(51) Int. Cl.
*H03M 13/29* (2006.01)
*H04L 1/00* (2006.01)

(52) U.S. Cl.
CPC ........ *H03M 13/2957* (2013.01); *H04L 1/005* (2013.01)

(58) Field of Classification Search
None
See application file for complete search history.

(56) References Cited

U.S. PATENT DOCUMENTS

| | | |
|---|---|---|
| 2015/0006992 A1 | 1/2015 | Xiong |
| 2019/0036550 A1 | 1/2019 | Koike-akino |
| 2019/0273512 A1 | 9/2019 | Chen |
| 2022/0103291 A1 | 3/2022 | Arikan |

FOREIGN PATENT DOCUMENTS

| | | |
|---|---|---|
| CN | 111200442 A | 5/2020 |
| CN | 114221664 A | 3/2022 |
| EP | 2916460 B1 | 9/2015 |
| FR | 2887378 A1 | 12/2006 |

OTHER PUBLICATIONS

Lee, et al., "Stochastic Erasure-Only List Decoding Algorithms for Reed-Solomon Codes", In proceedings of IEEE Signal Processing Letters, vol. 16, Issue 8, Aug. 2009, pp. 691-694.

(Continued)

*Primary Examiner* — Guerrier Merant

(74) *Attorney, Agent, or Firm* — Schwegman Lundberg & Woessner, P.A.

(57) ABSTRACT

Disclosed in some examples are methods, systems, devices, and machine-readable mediums which provide for an enhanced decoding system that utilizes a variable sequence decoding to demultiplex data streams at a receiver. For example, the receiver may utilize an erasures decoding when the number of unknown bits, such as dissimilar transmitted bits (e.g., '1 0' or '0 1'), is below a threshold (which may be the Hamming distance D−1). Otherwise, if the number of dissimilar transmitted bits is above the threshold, a list decoding is utilized. If the list decoding does not produce a single result, but instead produces multiple possible results, selection logic may be employed. The selection logic may utilize an errors and erasures decoding of the possible results, a media decoding of the possible results, and/or the like.

20 Claims, 9 Drawing Sheets

(56) References Cited

OTHER PUBLICATIONS

Schmidt, et al., "Error and Erasure Correction of Interleaved Reed-Solomon Codes", In proceedings of International Workshop on Coding and Cryptography, Mar. 14, 2005, pp. 22-35.
Wu, Yingquan, "New List Decoding Algorithms for Reed-Solomon and BCH Codes", In repository of arXiv: cs/0703105v3, Dec. 10, 2008, pp. 1-44.
Zhang, et al., "CRC Code Design for List Decoding of Polar Codes", In journal of IEEE Communications Letters, vol. 21, Issue 6, Jun. 2017, pp. 1229-1232.
International Search Report and Written Opinion received for PCT Application No. PCT/US2023/035652, Feb. 19, 2024, 18 pages.
Jason, Bellorado et al., "Low-Complexity Soft-Decoding Algorithms for Reed-Solomon Codes-Part II: Soft-Input Soft-Output Iterative Decoding", IEEE Transactions on Information Theory, vol. 56, Issue 3, Mar. 2010, pp. 960-967.

MULTIUSER DECODING USING ITERATIVE DECODERS

TECHNICAL FIELD

Embodiments pertain to decoding received data streams. Some embodiments relate to decoding a multiplexed data stream using sequential decoding.

BACKGROUND

Digital communications may take place over a variety of communication mediums. Example mediums include radio frequency (RF), electrical impulses over wires, light (either in-air or through a transmission medium such as fiber optic cable), and the like. In order to make use of these mediums, the digital communications protocol changes one or more medium properties to represent bits in a digital bitstream. For example, a magnetic field may be modified to convey 1's and 0's of a bitstream using modulation techniques such as Quadrature Amplitude Shift Keying which modifies properties of a carrier wave. To maximize the bandwidth of the medium and to allow multiple users to use the medium, various multiplexing techniques may be utilized to multiplex multiple bitstreams onto the medium at a same time.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
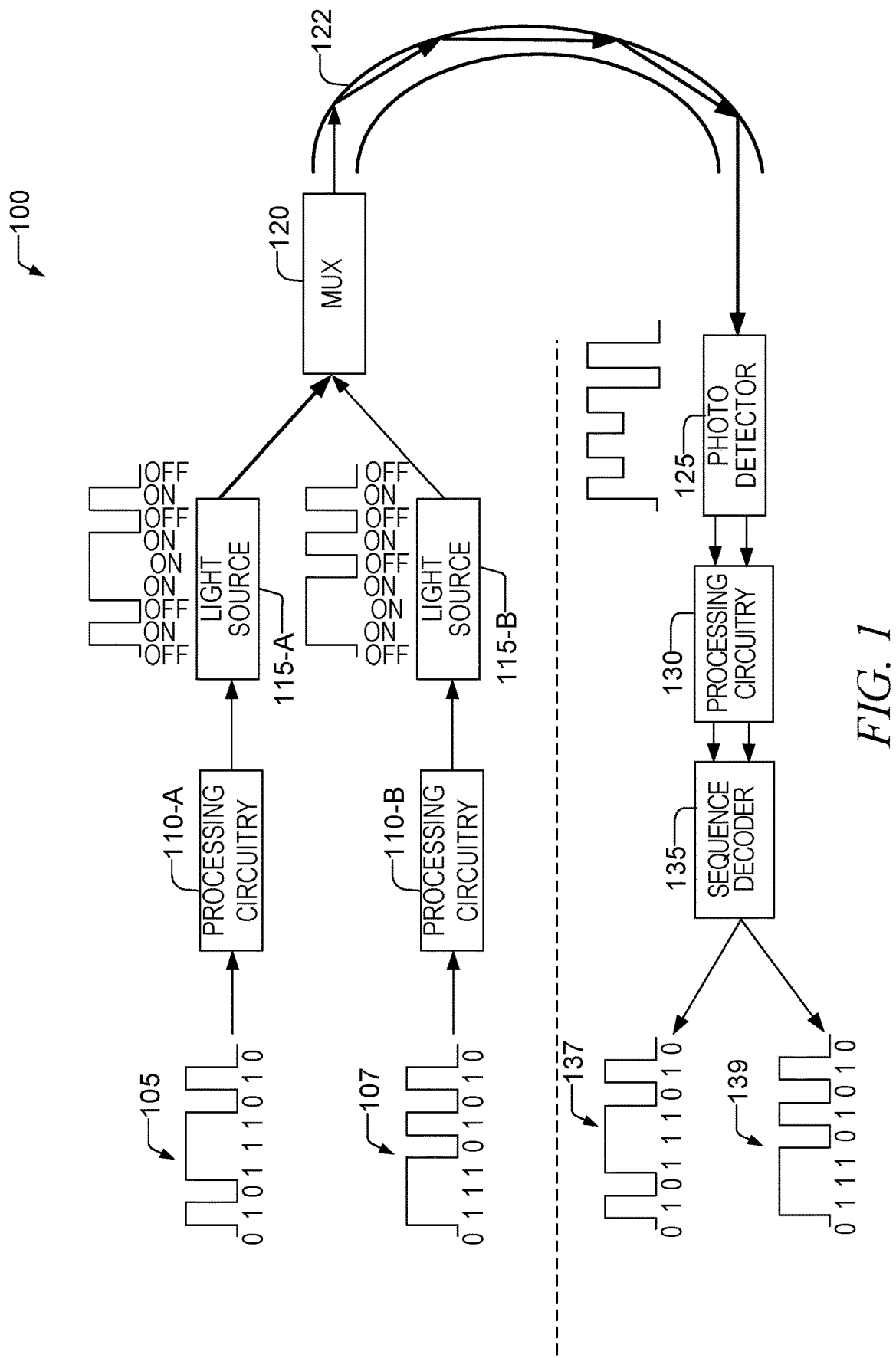
FIG. 1 illustrates components of a simplified optical communication system in the form of a fiber optic system according to some examples of the present disclosure.

Errors in transmitted bitstreams may be introduced both within the transmission medium itself (e.g., multipath reflections in RF), and also due to processing errors of the transmitter and/or receiver. For example, consider a fiber optic link where a transmitter powers on its photon generator at a constant power k to signify transmission of a '1' and turns off its photon generator to signify a '0' in the bitstream. In cases in which two transmitters are transmitting across the medium simultaneously, a receiver will be able to easily discern a [0,0] bit pair (e.g., a first zero for the bitstream for the first transmitter, a second zero for the bitstream for the second transmitter) as there will be very little received light photons; and a [1,1] bit pair where both transmitters are transmitting—as the number of received photons will be related to the sum of the "on" power of both transmitters (e.g., approximately 2 k); however, [1,0] and [0,1] bit-streams may be difficult to ascertain as the receiver may not know which transmitter was signifying a '1' and which was signifying a '0'.

Previous solutions to this problem assigned different properties to each transmitter. For example, a Wavelength Division Multiplexing (WDM) scheme assigns different wavelengths to each transmitter. In other examples, different power levels are assigned to each transmitter. For example, U.S. Pat. No. 10,873,392 titled "Throughput Increases for Optical Communications," filed on Apr. 18, 2019 (which is hereby incorporated by reference in its entirety) describes a system for using different power levels for each transmitter. In that disclosure, each light source corresponding to each data stream transmits at a same frequency and on the same optical communication path using a different power level. The receiver differentiates the data for each stream by applying one or more detection models to the photon counts observed at the receiver to determine likely bit assignments for each stream. An example detection model may be a Poisson distribution around an average number of photons received for a given bit assignment combination. As a result, multiple streams of data may be sent on a single optical link which may double, triple, quadruple, or more the bandwidth of a single channel on a single link.

Having different power levels to multiplex data may be disadvantageous in some scenarios, such as where device cost to implement a variable power transmitter and the attendant control circuitry may be too high. Examples of such scenarios include Internet of Things (IoT) devices such as sensors, and the like. In addition, by decreasing the power level, at least one transmitter may lose some transmission range. Thus, even some higher-powered applications may not wish to utilize variable power transmissions.

Similar to the optical domain, RF transmissions may suffer from interference, multipath fading, and other degradation prior to arriving at a receiver. As a result of these conditions, the receiver may have trouble de-multiplexing the signal.

Disclosed in some examples are methods, systems, devices, and machine-readable mediums which provide for an enhanced decoding system that utilizes a variable sequence decoding to demultiplex data streams at a receiver. For example, the receiver may utilize an erasures decoding when the number of unknown bits, such as dissimilar transmitted bits (e.g., [1, 0] or [0,1]), is below a threshold (which may be the Hamming distance D−1). Otherwise, if the number of dissimilar transmitted bits is above the threshold, a list decoding is utilized. If the list decoding does not produce a single result, but instead produces multiple possible results, selection logic may be employed to select one of the possible results as an output. The selection logic may utilize an errors and erasures decoding of the possible results, a media decoding of the possible results, and/or the like.

A communication signal is received and sampled to produce a sequence of bits that represent a portion of each of at least two bitstreams that were simultaneously transmitted in the signal by two different transmitters (either within a same device, or multiple devices). Bits that are unknown (such as [1 0] or [0 1]) in the bitstream portions may be marked as unknown in the bitstream portions. If the number of unknown bits in each bitstream portion does not exceed a threshold, an erasures decoder is used to fill in the unknown bits in each bitstream portion. If the number of unknown bits in the bitstreams does exceed the threshold, then a list decoding is used to fill in the unknown bits in each bitstream portion. In some examples, the bitstream portion is related to (e.g., a size of, or multiple of) a codeword size of a code applied to the bitstream prior to transmission or a codeword size used by one or more decoders.

In some example situations, the list decoder produces a single result. In these examples, the result is then fed to higher layers for additional processing. In some other example situations, the list decoding may not produce a single result for each stream, but instead, produce a list of possible decoded bitstream portions. In some examples, the list decoder may produce the list by randomly selecting bit values for unknown bits, sequential bit flipping, or the like. A decoding may then be selected from the list of possible decoded bitstream portions using selection logic.

In some examples, the selection logic may use an errors and erasures decoder that may attempt to correct each of the possible bitstream portions produced by the list decoder to produce a plurality of corrected bitstream portions. The corrected bitstream portions may then be used to select one of the possible decoded portions by determining the corrected bitstream portion that was produced the majority of the time. That is, the errors and erasures decoder may produce a same corrected bitstream portion for multiple input possible decoded bitstream portions. In these examples, the corrected bitstream portion that was produced the most is selected. In still other examples, an output bitstream portion may be created by determining, for each unknown bit value, the bit value for that position that occurs the majority of the time in the corrected bitstream portions.

In other examples, the selection logic may utilize one or more context clues about the contents of the data streams to select one of the potential decoded portions. For example, by using media recognition (voice and/or video) the different potential decoded portions may be passed to a media decoder to determine whether the potential decoding properly decodes a media sample. The potential decoded portion which successfully decodes in the media decoder may then be used. In other examples, where multiple potential decoded portions successfully decode in the media decoder, the potential decoded portion that does so with the fewest errors may be selected. In still other examples, the system may select one of multiple potential decoded portions that successfully decode in the media decoder based upon a quality of the produced media.

The disclosed technical solutions solve the technical problem of errors in multiplexing data in digital transmissions over transmission mediums such as RF and optical. The disclosed solutions solve this technical problem using the technical solution of using a variable decoder sequence that changes the decoder that is used depending on the number of unknown bits. In some examples, the disclosure solves the technical problem of selecting a correct decoding sequence from multiple potential decoding sequences produced by a list decoder using the technical solution of using additional decoders and/or context information from higher layers in the network stack such as by using media decoding and quality evaluation techniques.

In some examples, the erasures decoding may any coding and decoding technique utilizing a forward error correction code which transforms a message of k symbols into a longer message (code word) with n symbols such that the original message can be recovered from a subset of the n symbols. Examples include a parity check, a polynomial oversampling algorithm, fountain codes, tornado codes, low-density parity-check codes, online codes, LT codes, Raptor codes, network codes, Reed-Solomon codes, Erasure Resilient Systematic Code, Maximum Distance Separable Code, or the like.

In some examples, the list decoding may be a coding and decoding technique that may output a single correct bitstream, or, instead of outputting a single possible bit sequence, may output a list of possibilities, one of which is correct. Examples include Sudan '95, Guruswami-Sudan '98, Parvaresh-Vardy '05, Guruswami-Rudra '06 and other algorithms.

Errors and erasure codes may be coding and decoding technique that may correct both errors (bits flipped incorrectly) and erasures (missing bits). Examples include Reed-Solomon Codes.

FIG. 1 illustrates components of a simplified optical communication system in the form of a fiber optic system 100 according to some examples of the present disclosure. FIG. 1 illustrates an example of a data transmission system in which the present disclosure may be used. FIG. 1 is exemplary only and other data transmission systems may be used, such as RF transmission systems. In addition, the fiber optic system 100 is exemplary and it will be appreciated by a person of ordinary skill in the art having the benefit of the present disclosure that more or fewer components may be present than is shown. Likewise, a person skilled in the art having the benefit of the present disclosure will appreciate that components shown may be combined and/or split up into subcomponents.

A first data stream 105 may comprise binary data produced by higher network layers. First data stream 105 is processed by processing circuitry 110-A. Processing circuitry 110-A may process the data of first data stream 105 in one or more ways to prepare it for transmission. Example processing operations performed by the processing circuitry 110-A includes data encoding such as applying one or more error correction codes, compression algorithms, encryption algorithms, and/or the like. The data, as transformed by the processing circuitry 110-A, is then passed as a control signal to a light source 115-A. The light source 115-A modulates the data by selectively turning the light source on and off in accordance with the input data according to a modulation scheme. For example, in a simple modulation scheme, each bit may be transmitted during a predetermined period of time (e.g., a timeslot). During a particular timeslot, if the current bit from the input data is a '1', the light source may be turned on during the timeslot and if the current bit from the input data is a '0', the light source may be turned off during the timeslot. Other, more complex modulation schemes may be utilized such as amplitude, phase, or polarization modulation. In some examples, the bitstream may be modulated on a sine wave by modifying properties of the sine wave.

In some examples, a second data stream 107 may be produced by a same or different device. The second data stream 107 may comprise binary data produced by higher network layers. The second data stream 107 is processed by processing circuitry 110-B. Processing circuitry 110-B may process the data of second data stream 107 in one or more ways to prepare it for transmission. Example processing operations performed by the processing circuitry 110-B includes data encoding such as applying one or more error correction codes, compression algorithms, encryption algorithms, and/or the like. The data, as transformed by the processing circuitry 110-B, is then passed as a control signal to a light source 115-B. The light source 115-B modulates the data by selectively turning the light source on an off in accordance with the input data according to a modulation scheme. For example, in a simple modulation scheme, each bit may be transmitted during a predetermined period of time (e.g., a timeslot). During a particular timeslot, if the current bit from the input data is a '1', the light source may be turned on during the timeslot and if the current bit from the input data is a '0', the light source may be turned off during the timeslot. Other, more complex modulation schemes may be utilized such as amplitude, phase, or polarization modulation. In some examples, the light may be modulated on a sine wave.

Multiplexer (mux) 120 may combine the light produced by the light sources 115-A and 115-B. This produces a combined signal. The combined signal produced by the light source then travels over an optical communication path to the receiver. While the mux 120 is shown as multiplexing the light from light sources 115-A and 115-B, in other examples, the data streams 105 and 107 may be multiplexed prior to a light source and only one light source may transmit the light according to the multiplexed signal. While processing circuitry 110-A and 110-B as well as light source 115-A and 115-B are shown as separate components in FIG. 1, in other examples, one or more may be a same component that may process data in parallel or serially.

An optical communication path is the path taken by the light source from the transmitting light source to the receiving sensor. This path may be through one or more mediums, such as a single fiber optic fiber, air, or the like. In the example of FIG. 1 the optical communication path travels across a single fiber optic fiber 122. In examples in which the medium is air, the optical communication path may be the alignment of the transmitting light source and the sensor at the receiver.

The receiver includes a photo detector 125, processing circuitry 130, and sequence decoder 135. The photo detector 125 collects a count of a number of photons detected over a detection time period which corresponds to an amount of time that a single bit pair comprising a single bit from each of data streams 105, 107 are transmitted. Based upon the photon counts, the photo detector produces multiple data streams that are then input to the processing circuitry 130 which may apply inverse operations than were applied by the processing circuitry 110 (except for decoding). Sequence decoder 135 then decodes the streams and resolves any unknown bits to produce output stream portions 137, and 139.

In some examples, the processing circuitry 130, 110-A, and 110-B may apply their processing, such as encoding and decoding based upon a plurality of bits in each stream, such as a number of bits corresponding to, or a multiple of, a size of a codeword of a code applied to the data. Thus, bits detected by photo detector 125 may be buffered for a specified number of bits for each stream prior to the processing circuitry 130 applying its processing to the entire sequence of bits. The sequence of bits processed by processing circuitry 130 may be a portion of a bitstream as it represents more than a single bit of the bitstream, but less than the entire bitstream (which may continue for hours in the case of video streaming—such as streaming of a movie).

Figure 2:
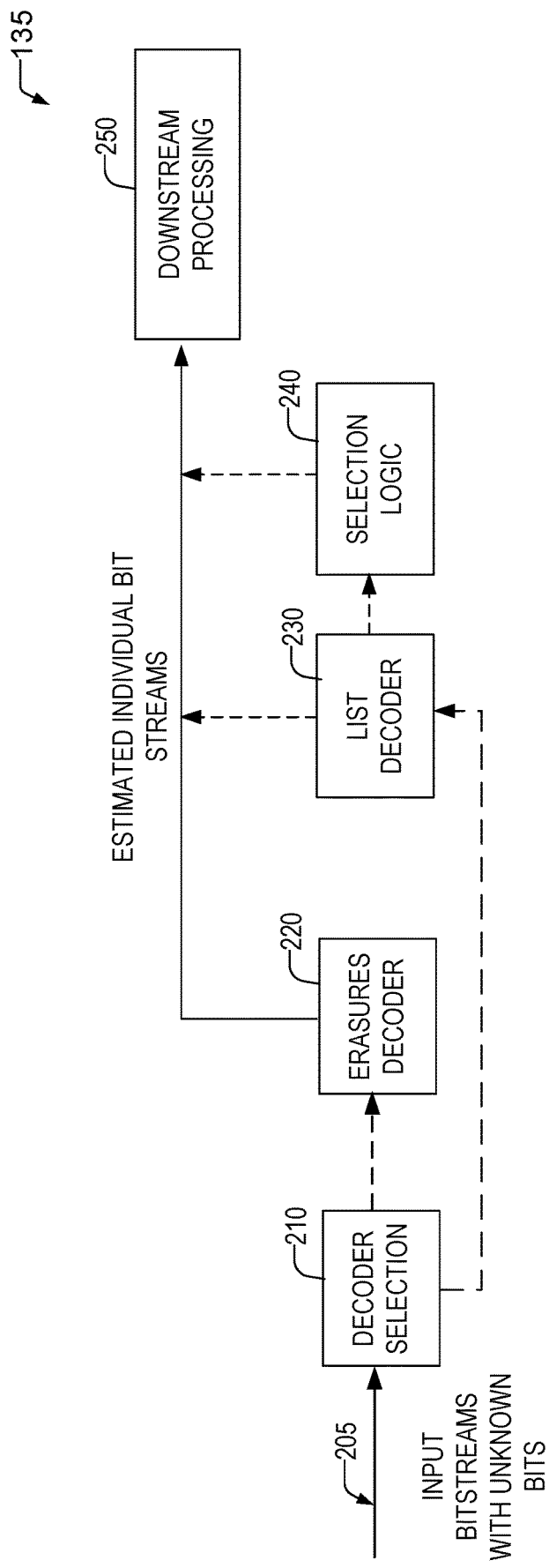
FIG. 2 illustrates an example of a sequence decoder according to some examples of the present disclosure.

As noted, bits that cannot be discerned by the photo detector 125 and/or processing circuitry 130 may be determined by the sequence decoder 135. FIG. 2 illustrates an example of a sequence decoder 135 according to some examples of the present disclosure. A data stream portion 205 arrives with information on which bits in the stream are known and which bits are unknown. A number of bits of the portion may correspond to a codeword size. As noted above, in the modulation scheme shown in FIG. 1, unknown bits may be bit sequences where the observed power level at the photodetector is k, where k is the power of the transmitter when transmitting a '1' bit. This indicates that one transmitter, but not both, were active during a particular time period. The receiver does not necessarily know which transmitter active and thus which stream had transmitted a '1' and which transmitter had transmitted a '0'.

Decoder selection component 210 determines a number of unknown bits in the input bitstream portion. The decoder selection component 210 compares the determined number of unknown bits in one or more of the input bitstream portions and compares it to a threshold. The threshold N may be set based upon a Hamming distance D. For example, the threshold may be D−1. If the number of unknown bits in the bit stream portion is below the threshold, the decoder selection component 210 sends the bitstream portion to an erasures decoder component 220 where an erasures decoder is implemented and processes the bitstream portion to produce a result. If the number of unknown bits in the bitstream portion is above, or equal to the threshold, the decoder selection component 210 sends the bitstream portion to the list decoder component 230 where a list decoder is implemented and processes the bitstream portion to produce a result. The results produced by the erasures decoder component 220 and list decoder component 230 are sent to downstream processing component 250 where additional processing may be performed before the data is output or sent to another device.

In some examples, a list decoder may comprise a dynamic Viterbi decoder with a number of states that depends on the threshold N. As noted, rather than a single result, the list decoder component 230 may produce a plurality of potential bit stream portions. Each potential bit stream portion may have unknown bits in the bitstream portion filled in by the list decoder. These potential bit streams may have the unknown bits filled in by the list decoder using a decoding algorithm such as a Viterbi decoding algorithm, by random selection, a sequence of all possible values for the unknown bits, unknown bit sequences that represent a highest probability of being correct, or the like. The plurality of potential bit stream portions may then be fed to the selection logic 240. Selection logic 240 may select from the potential bit streams. In some examples, the selection logic 240 may include an errors and erasures decoder which may determine which of the potential bit streams is correct. If multiple potential bit streams are correct, a potential bit stream portion with the fewest uncorrected errors may be chosen. In other examples, since the errors and erasures decoder corrects errors, each resultant potential bit stream portion that is corrected represents a corrected potential bitstream portion. The corrected potential bitstream portions may then be compared to each other. A most common corrected potential bitstream portion may be selected for output.

For example, if the output of the list decoder is four potential bitstreams {0, 1, 1, 1, 0}; {0, 1, 1, 0, 0}; {1, 0,1,1,0}; and {0,0,1,1,0} and the errors and erasures decoder produces the following four corrected potential bitstreams from the four potential bitstreams: {0, 1, 1, 1, 1}; {0, 1, 1, 1, 1}; {1, 1,1,1,1}; and {0, 1, 1, 1, 0} then the selected bitstream is the one produced mostly commonly by the errors and erasures decoder: {0,1,1,1,1}.

In other examples, instead of, or in addition to using the errors and erasures decoder, a correct potential bitstream may be chosen from the multiple potential bitstreams based upon context information on what the data is. For example, if the data is media data, each potential bitstream portion may be input into a media decoder that may attempt to decode the media. If only one of the potential bitstream portions decode in the media decoder, then that is chosen as the output bitstream portion. If multiple potential bitstream portions decode, then a quality or other analysis may be done on each of the media decoding results from each of the multiple potential bitstreams that decode. The potential bitstream portion that decoded in the media decoder with the best quality may be chosen.

Figure 3:
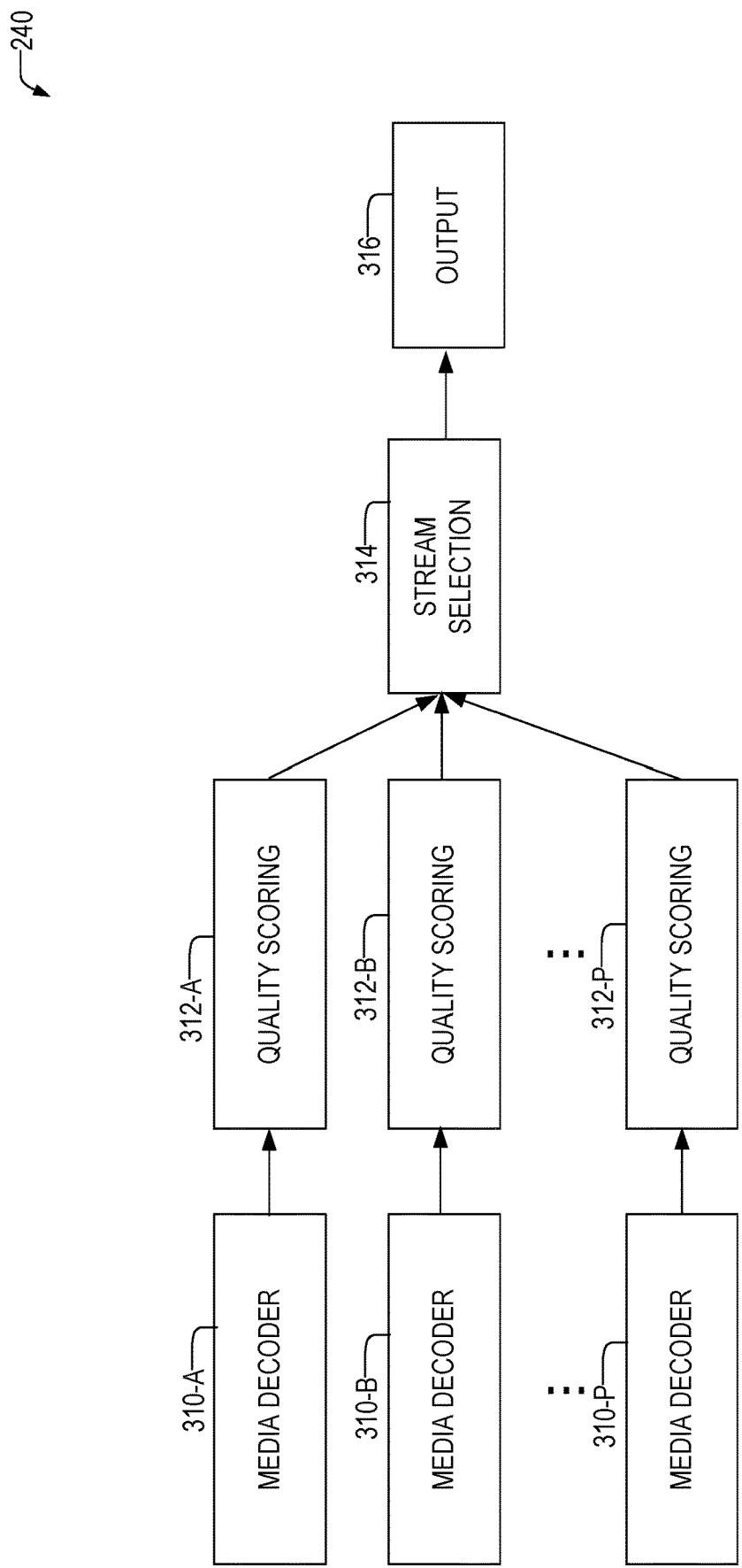
FIG. 3 illustrates a selection logic using media decoding according to some examples of the present disclosure.

FIG. 3 illustrates a selection logic 240 using media decoding according to some examples of the present disclosure. Media decoder instances 310-A, 310-B . . . 310-P may each process one of the plurality of possible bitstream portions (e.g., the output of the list decoder). Each media decoder 310 may then have the decoded media output scored by a quality scoring component instances 312A, 312B . . . 312P. Quality scoring components may then produce a quality score of the output. The stream selection 314 may then select the output of the media decoder of the possible decoding that has a highest quality score, which is then fed to the output component 316 where it may be output to a user, sent to another computing device (e.g., over a network), or the like. If a probable bitstream cannot be decoded, the media decoder and quality scoring component may produce a poor quality score or the probable bitstream may be eliminated altogether from future consideration. In some examples, failure to decode using the media decoder may result in the quality scoring done by quality scoring component 312-A, 312-B, . . . 312-P to be skipped. In some examples, P may be a maximum amount of potential bitstream portions produced by the list decoder. Thus, each of the potential bitstream portions in some examples may be processed in parallel. In other examples, P may be less than the maximum amount of potential bitstream portions produced by the list decoder. In these examples, multiple passes may be used to process the plurality of potential bitstream portions. In some examples, the output of the media decoder may be sent directly to an output device or for further processing, skipping media decoding that would normally happen later in a data processing pipeline.

Example quality scoring algorithms for video may include one or more of: a Naturalness Image Quality Evaluator (NIQE), a Blind/Referenceless Image Spatial Quality Evaluator (BRISQUE), Video-Blinds, or the like. In some examples, each media decoder instance 310A, 310B . . . 310N may execute in parallel. In addition, in some examples, the quality scoring component instances 312A, 312B . . . 312N may also execute in parallel. In these examples, the only added latency of the system may be in the calculation of, and comparison of the quality metrics.

Figure 4:
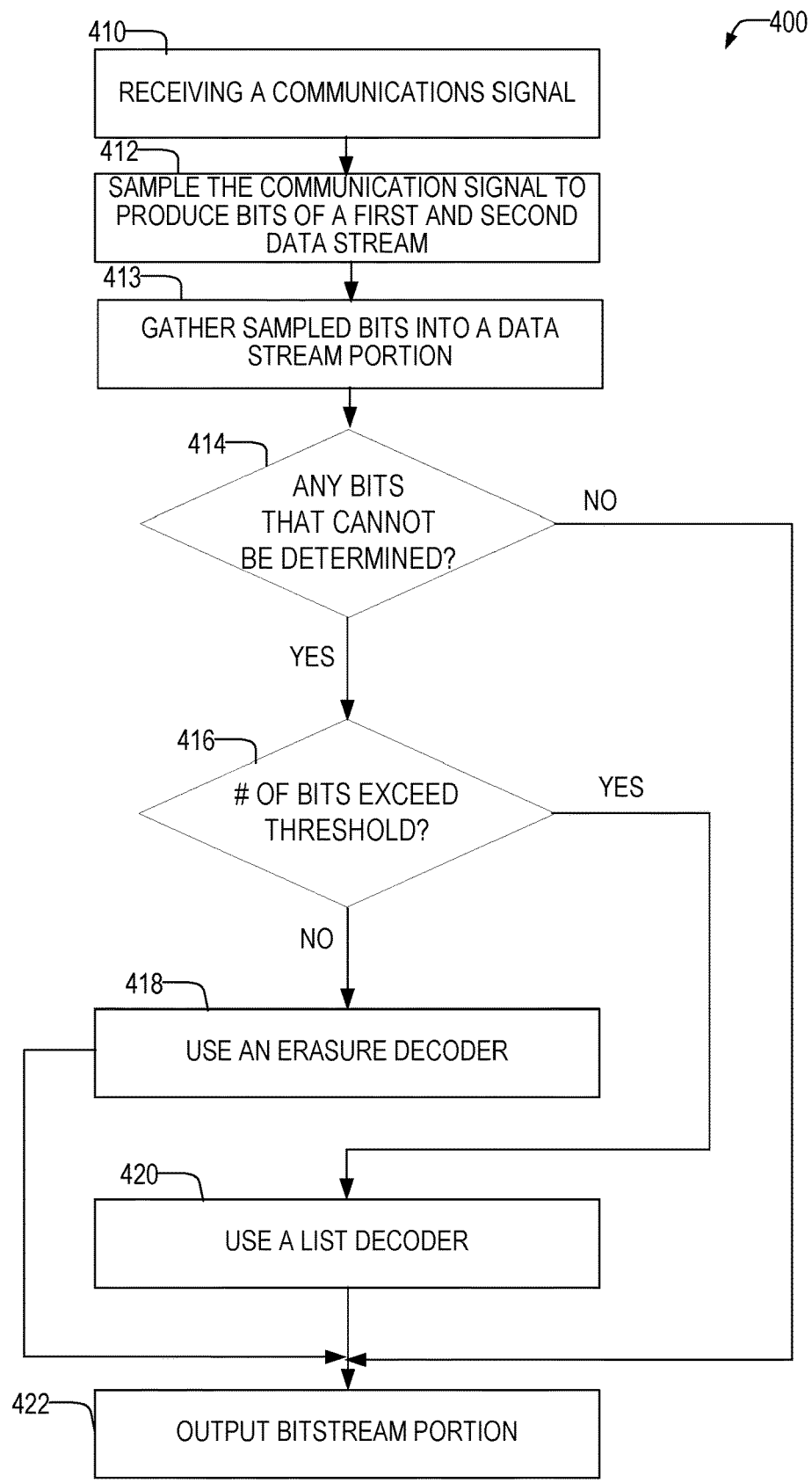
FIG. 4 illustrates a flowchart of a method of sequence-based decoding according to some examples of the present disclosure.

FIG. 4 illustrates a flowchart of a method 400 of sequence-based decoding according to some examples of the present disclosure. At operation 410 the receiver receives a communication signal. At operation 412, the communication signal may be sampled to produce bits of a first and second data stream. For example, by counting a number of photons hitting a receiver and translating that to a bit assignment for each stream. As another example, demodulating bits using a technique such as Quadrature Phase Shift Keying.

At operation 413, a set of sampled bits are assembled into a portion of each of the two bit streams. For example, a series of G decoded bits for each stream. In some examples, G may be a codeword size for a code applied to the transmission.

At operation 414, it is determined if any of the bits in the bitstream portion could not be determined. For example, in an optical system where each of two transmitters uses a same power level k, a received optical power of A would produce two different possible decodings—[0,1] or [1,0]. If all bits in the portion can be successfully determined, then at operation 422, the bitstream portion is output.

If there are bits that cannot be determined, then at operation 416 a determination is made whether the number of bits in the bitstream portion that cannot be determined exceeds a threshold N. The threshold N may be determined based upon a Hamming Distance D. In particular, in some examples, N may be equal to one less than D. If the number of bits does not exceed the threshold, then at operation 418, an erasure decoder is used to determine the bits that cannot be determined. The output of the erasure decoder may then be output at operation 422. If the number of bits does exceed the threshold, then at operation 420, a list decoder is utilized. The output of the list decoder 420 may then be output at operation 422.

Figure 5:
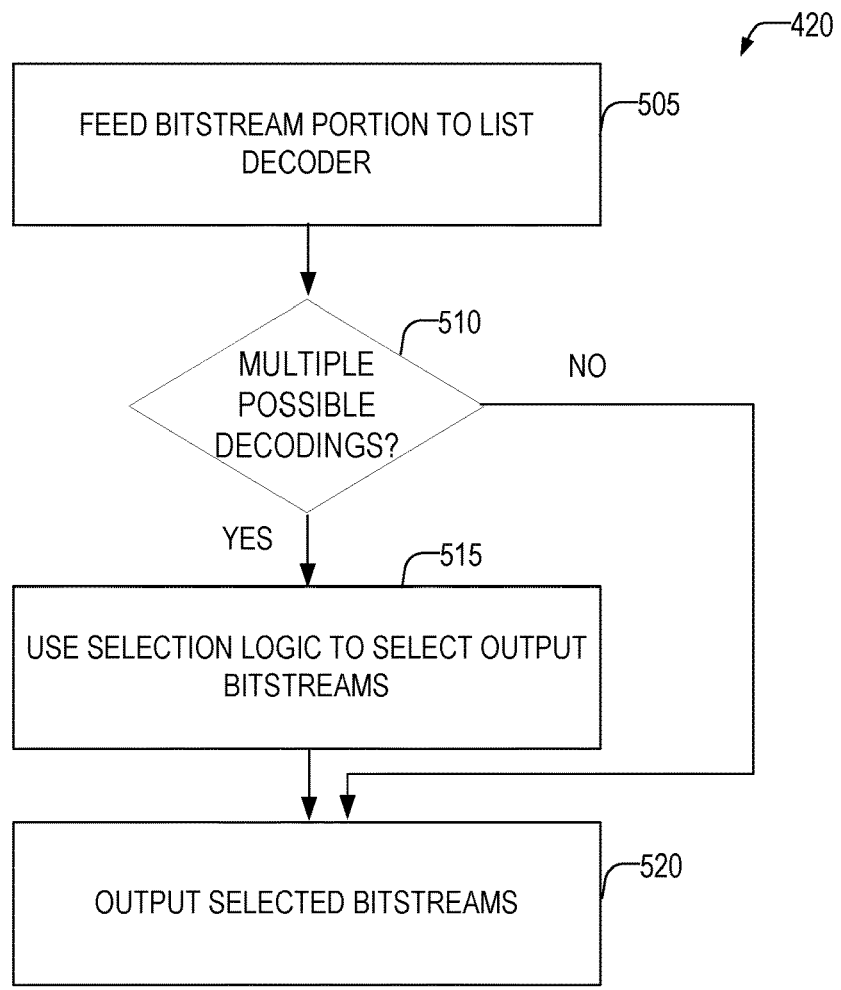
FIG. 5 illustrates a flowchart of a list decoder method according to some examples of the present disclosure.
Figure 6:
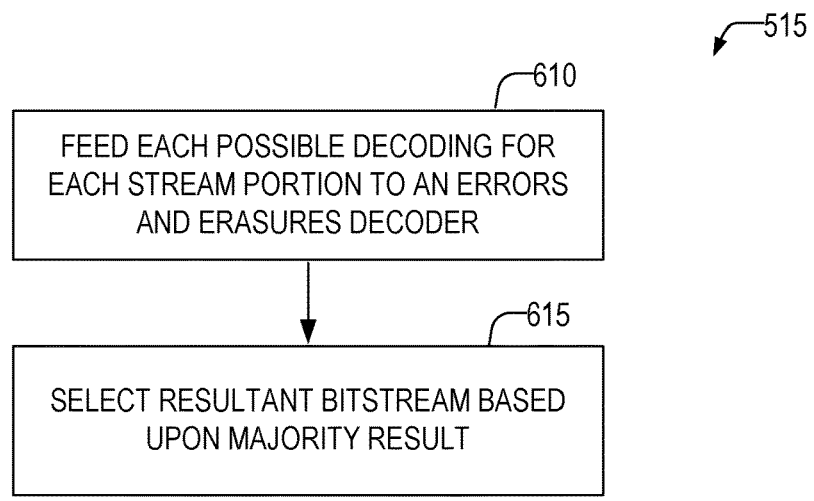
FIG. 6 illustrates a flowchart of a method of a selection logic operation using an errors and erasures decoder to select one of the plurality of possible bitstream portions produced by a list decoder according to some examples of the present disclosure.
Figure 7:
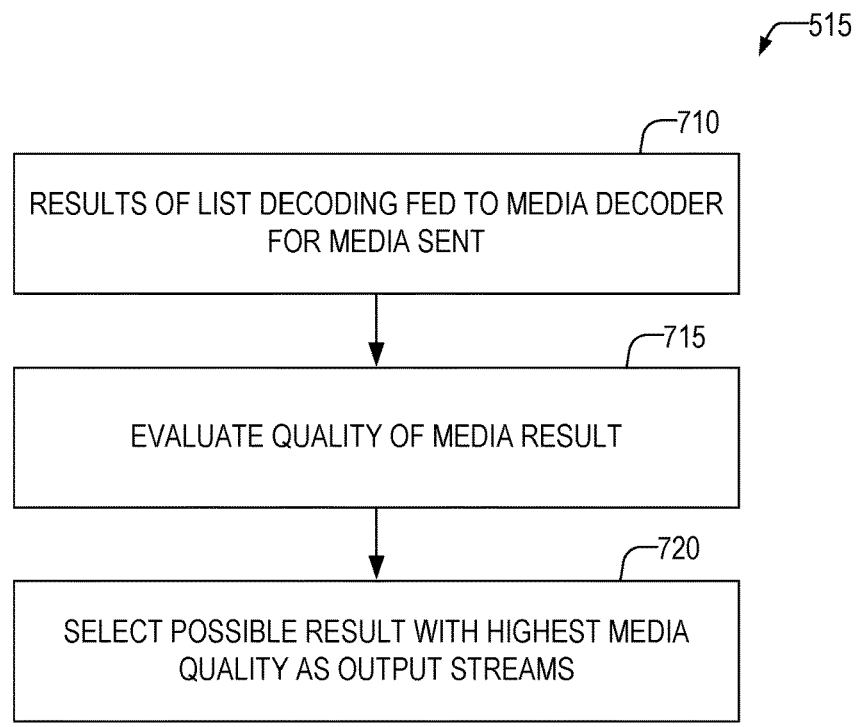
FIG. 7 illustrates a flowchart of a method of a selection logic using media decoding according to some examples of the present disclosure.

FIG. 5 illustrates a flowchart of a list decoder method 420 according to some examples of the present disclosure. At operation 505, each bitstream portion may be fed to the list decoder. Example list decoders may include Sudan '95, Guruswami-Sudan '98, Parvaresh-Vardy '05, and Guruswami-Rudra '06. At operation 510, a determination is made whether the list decoder produced multiple possible decoding possibilities for the bitstream portions. If yes, then at operation 515, the system may use a selection logic to select an output bitstream portion. Example selection logic may be the media decoding shown in FIG. 3, use of an errors and erasures decoder, or the like. FIGS. 6 and 7 provide example methods of using errors and erasures decoding and media decoding respectively. The selected bitstream is output at operation 520. If only a single decoding was output, then at operation 510, flow proceeds to operation 520 where that single decoding is output.

In some examples, the list decoder may produce a single decoding for a first one of the two bitstream portions, but multiple decodings for the second of the two bitstream portions. In examples in which only two bitstreams are transmitted simultaneously, the selection logic may select the possible bitstream portion for the second of the two bitstream portions by utilizing the possible bitstream portion that has bit decodings for undetermined bits that are opposite the bits selected for those bits within the single decoding for the first one of the two bitstream portions. For example, for optical decoding for two streams, the two possible decodings are [0,1] and [1,0] for undetermined bit positions, if the list decoder produces a bitstream for a first stream with a '0' in one of these bit positions, the other bitstream position must be a '1' or vice versa.

FIG. 6 illustrates a flowchart of a method of a selection logic operation 515 using an errors and erasures decoder to select one of the plurality of possible bitstream portions produced by a list decoder according to some examples of the present disclosure. At operation 610, each of the possible bitstream portions is fed to an errors and erasures decoder. Example errors and erasures decoders include a Reed-Solomon decoder. The errors and erasures decoder attempts to correct any errors in each of the possible bitstream portions to produce a plurality of corrected possible bitstream portions.

At operation 615, a resultant bitstream may be selected from the corrected possible bitstream portions. In some examples, the resultant bitstream may be selected as a most common bit stream in the corrected possible bitstream portions. That is, if there are 10 possible bitstreams produced by the list decoder, and the errors and erasures decoding of these 10 possible bitstreams produces a same first bitstream 6 times, and a same second bitstream 4 times, the first bitstream is used as it was the majority bitstream. In still other examples, the selection logic may compare each unknown bit position and select the bit value for that position that was produced in a majority of the corrected possible bitstream portions to form an output bitstream portion.

FIG. 7 illustrates a flowchart of a method of a selection logic 515 using media decoding according to some examples of the present disclosure. At operation 710, each possible decoding produced by the list decoder may be fed to a media decoder for the media being sent. For example, if the media is video the media may be fed to a video decoder. Audio may be sent to an audio decoder, and the like. The media type being sent may be provided as feedback by higher layers in the application stack. For example, if the media being sent is related to a network-based communication session (e.g., an online meeting), the network-based application that provides the network-based communication session may provide the feedback on the media. In some examples, the list decoder may provide all the possible decodings to the network-based application, which may then implement the selection logic.

At operation 715, the quality of the media output from the media decoder of each of the plurality of possible bitstream portions may be evaluated. In some examples, a possible bitstream portion that fails to decode may be removed from further consideration. The media quality of the media decoding from the remaining possible bitstream portions is then evaluated at operation 715. For example, by using a quality scoring algorithm such as those shown in FIG. 3.

At operation 720, the possible bitstream portion with the best media quality may be selected and output to the user. In some examples, the selected bitstream portion may be sent to another component where the media may be decoded again—which may be useful in situations where the media may be mixed with other media, or the output of the media decoder may be directly provided to higher level layers. In other examples, the media as decoded may be passed to other components and/or layers for output.

In addition to using either an errors and erasures decoding or a media decoder to select potential bitstream portions produced by the list decoder, in some examples, both may be used. For example, the errors and erasures decoding may be used to filter the list of potential bitstreams. The filter may be based upon the number of errors corrected by the errors and erasures decoding. For example, by selecting the x potential bitstreams with the fewest errors, corrected errors, or uncorrectable errors. The filtered list of potential bitstreams may then be input into the process of FIG. 7 for selection of a final bitstream.

In addition to errors and erasures and/or media decoding to determine a selected encoding, machine-learning models may be used. For example, a model may learn bit patterns of a communication session and may be used to predict a series of unknown bits in a bit stream portion. That is, given an input data stream with unknown bits in various bit positions, the machine-learning model may predict the unknown bits, which may be used as the output bitstreams. In other examples, the model may input a plurality of potential bitstreams from the list decoder and may choose one of the potential bitstreams. This may be useful for repeated patterns of data. For example, in some scenarios "comfort noise" is added to fill silence in communications to avoid users from feeling that a connection has been lost. This data may have a well-defined signature and thus, uncertain bits may be discernible by looking for these patterns.

The model may be specifically created for a particular communication session using training data from the particular communication session. In other examples, the model may be for a particular person and may be trained based upon multiple communication sessions of the particular person. In yet other examples, the model may be for a particular group of participants of the session and trained using data from those sessions. In other examples, the model may be a general model, trained using various input data streams that are not specific to a particular user, session, or application.

Figure 8:
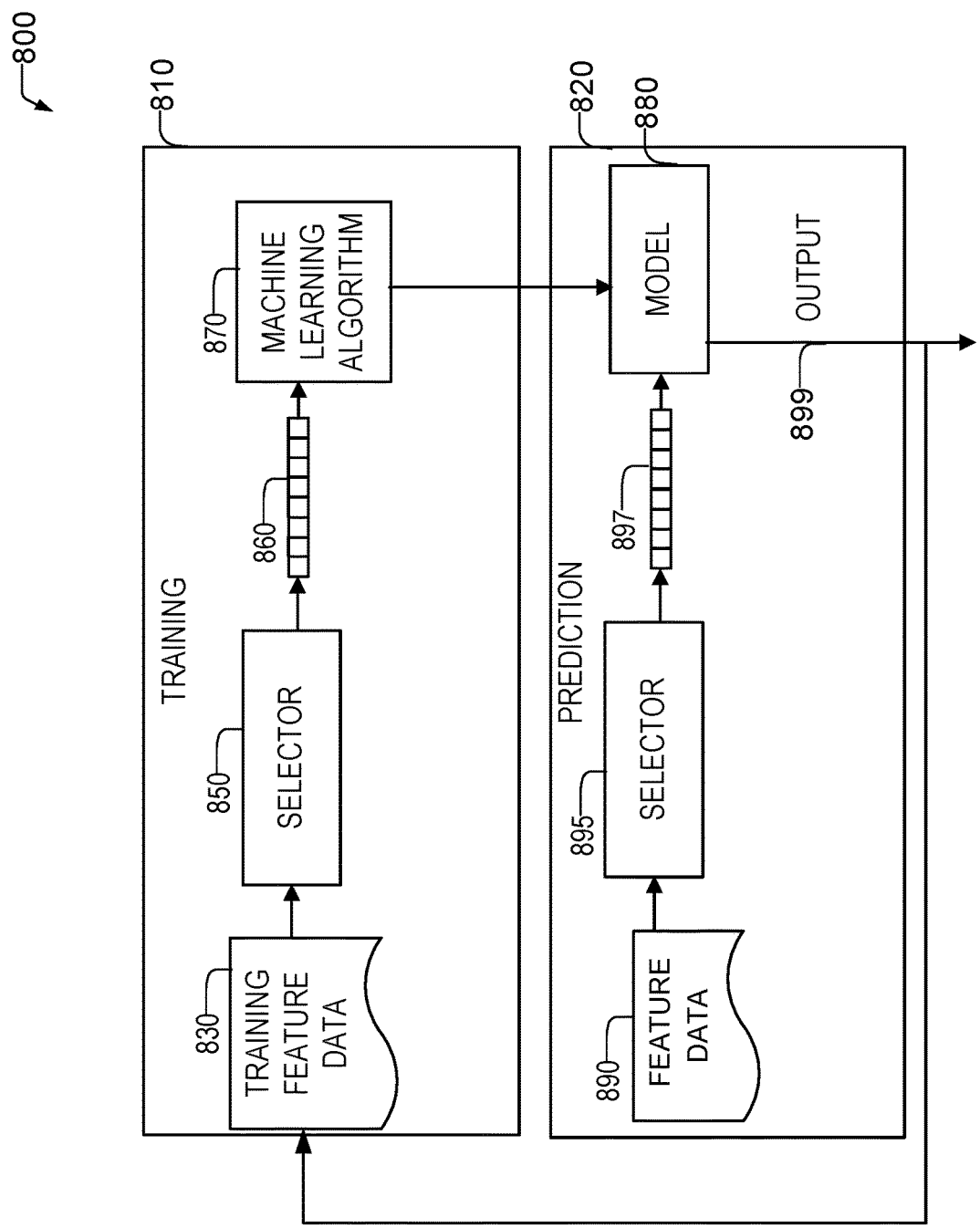
FIG. 8 shows an example machine learning module according to some examples of the present disclosure.

As previously noted, the system may utilize one or more machine-learning algorithms, for example, to decide unknown bits and/or to decide on a possible decoding produced by a list decoder. FIG. 8 shows an example machine learning module 800 according to some examples of the present disclosure. The machine learning module 800 may be implemented in whole or in part by one or more computing devices. In some examples, the training module 810 may be implemented by a different device than the prediction module 820. In these examples, the model 880 may be created on a first machine and then sent to a second machine.

Machine learning module 800 utilizes a training module 810 and a prediction module 820. Training module 810 inputs training data 830 into selector module 850. The training data 830 may include one or more sets of training data. The training data 830 may be labeled with the desired output. In other examples, the training data may not be labeled, and the model may be trained using feedback data—such as through a reinforcement learning method. The feedback data may be a measure of error between a desired result of the algorithm and the actual result.

Selector module 850 converts and/or selects training vector 860 from the training data 830. For example, the selector module 850 may filter, select, or otherwise convert the training data. For example, the selector module 850 may apply one or more feature selection algorithms to find features in the training data. The selected data may fill training vector 860 and comprises a set of the training data that is determined to be predictive of an encoding. Information chosen for inclusion in the training vector 860 may be all the training data 830 or in some examples, may be a subset of all the training data 830. Selector module 850 may also convert or otherwise process the training feature data 830 such as normalization, encoding, and the like. The training vector 860 may be utilized (along with any applicable labels) by the machine learning algorithm 870 to produce a model 880. In some examples, other data structures other than vectors may be used. The machine learning algorithm 870 may learn one or more layers of a model. Example layers may include convolutional layers, dropout layers, pooling/up sampling layers, SoftMax layers, and the like. Example models may be a neural network, where each layer is comprised of a plurality of neurons that take a plurality of inputs, weight the inputs, input the weighted inputs into an activation function to produce an output which may then be sent to another layer. Example activation functions may include a Rectified Linear Unit (ReLu), and the like. Layers of the model may be fully or partially connected.

In the prediction module 820, feature data 890 is input to the selector module 895. Selector module 895 may operate the same, or differently than selector module 850. In some examples, selector modules 850 and 895 are the same modules or different instances of the same module. Selector module 895 produces vector 897, which is input into the model 880 to produce an output 899. For example, the weightings and/or network structure learned by the training module 810 may be executed on the vector 897 by applying vector 897 to a first layer of the model 880 to produce inputs to a second layer of the model 880, and so on until the encoding is output. As previously noted, other data structures may be used other than a vector (e.g., a matrix).

The training module 810 may operate in an offline manner to train the model 880. The prediction module 820, however, may be designed to operate in an online manner. It should be noted that the model 880 may be periodically updated via additional training and/or user feedback. For example, additional training data 830 may be collected as users provide feedback on the performance of the predictions.

The machine learning algorithm 870 may be selected from among many different potential supervised or unsupervised machine learning algorithms. Examples of learning algorithms include artificial neural networks, convolutional neural networks, Bayesian networks, instance-based learning, support vector machines, decision trees (e.g., Iterative Dichotomiser 3, C4.5, Classification and Regression Tree (CART), Chi-squared Automatic Interaction Detector (CHAID), and the like), random forests, linear classifiers, quadratic classifiers, k-nearest neighbor, linear regression, logistic regression, a region based CNN, a full CNN (for semantic segmentation), a mask R-CNN algorithm for instance segmentation, and hidden Markov models. Examples of unsupervised learning algorithms include expectation-maximization algorithms, vector quantization, and information bottleneck method.

As noted, the machine learning module 800 may be used to predict the unknown bits in a bitstream portion. In these examples, the training feature data 830 would be correct bitstream portions and the feature data 890 may be the input bitstream portions with the undetermined bits marked. The output 899 may comprise the values of the unknown bits.

In other examples, the machine learning module 800 may be used to predict the correct decoding in a list of possible bitstream portions produced by a list decoder. In these examples, the training feature data 830 would be correct bitstream portions and the feature data 890 may be the output of the list decoder (e.g., the plurality of potential bitstream portions). The output 899 may comprise a selection of the correct bitstream portion. In either of the above examples, another input may be an indication of the type of media. That is, the predicted bits may differ based upon the media.

In the examples shown previously, the system is demultiplexing at least two streams and attempting to correctly decode them. The decoding techniques may have been described with respect to a single one of the multiplexed streams, but the same techniques may be applied in parallel or serially to the other streams. In instances in which only two streams are multiplexed, the decoding techniques may be applied to only a first one of the streams and the resultant bitstream of the second stream may be determined based upon the first stream. For example, if the two streams share an unknown bit, and the modulation scheme is such that only two possibilities exist: the first stream is a one and the second stream is a zero OR the first stream is a zero and the second stream is a one; then if it is determined that the first stream is likely a one, then a zero is substituted into the unknown bits in the second stream.

In some examples, prior to the forward error correction coding, a cyclic redundancy check (CRC) may be employed. If the CRC fails, then it may signal that there is an error in the FEC code that cannot be corrected. In these examples, a decoder can flip the least reliable bits (according to the CRC) and attempt a second decoding. This may be repeated until a decoding is successful.

Figure 9:
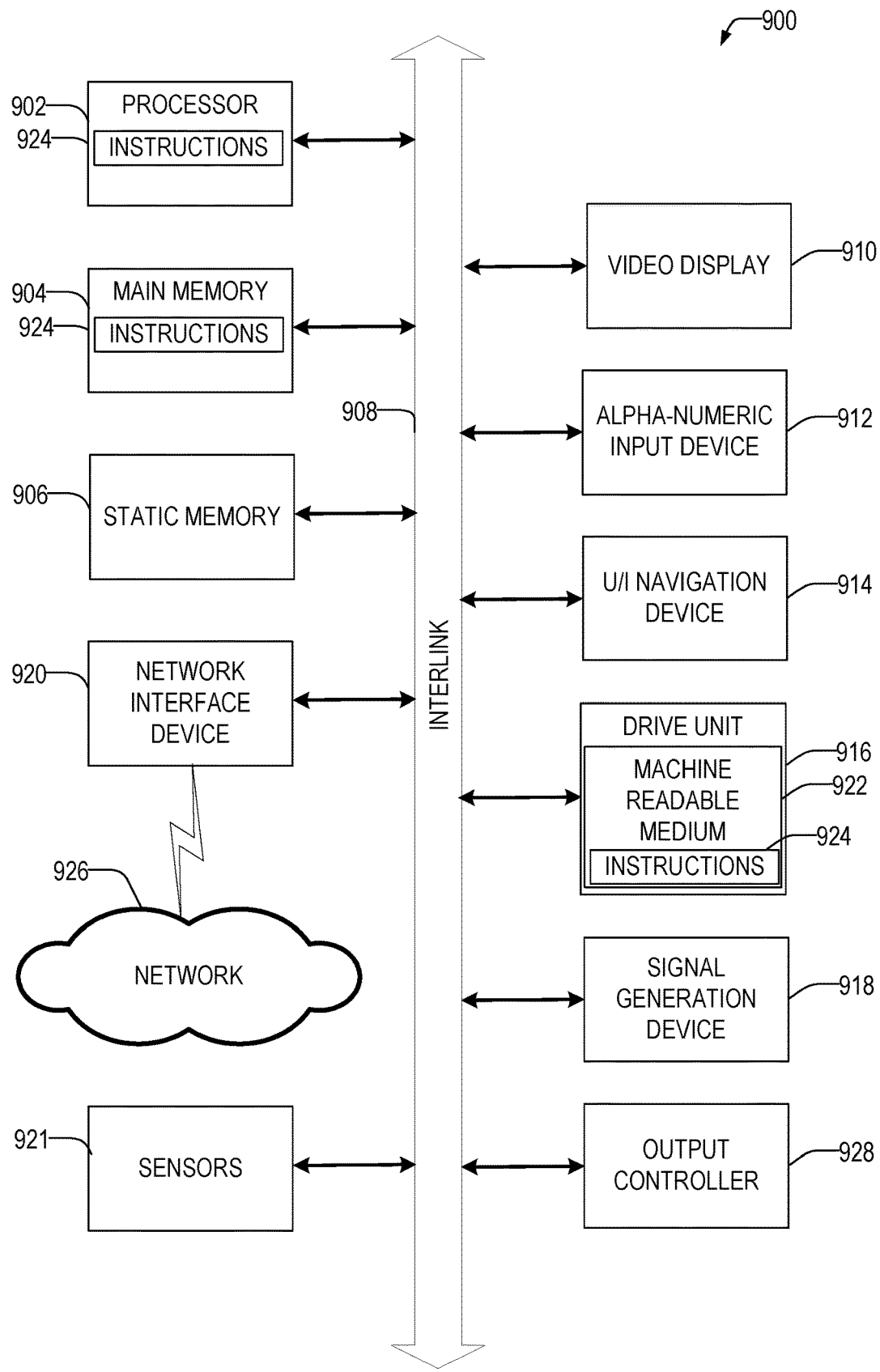
FIG. 9 is a block diagram illustrating an example of a machine upon which one or more embodiments may be implemented.

FIG. 9 illustrates a block diagram of an example machine 900 upon which any one or more of the techniques (e.g., methodologies) discussed herein may be performed. In alternative embodiments, the machine 900 may operate as a standalone device or may be connected (e.g., networked) to other machines. In a networked deployment, the machine 900 may operate in the capacity of a server machine, a client machine, or both in server-client network environments. In an example, the machine 900 may act as a peer machine in peer-to-peer (P2P) (or other distributed) network environment. The machine 900 may be in the form of a server computer, personal computer (PC), a tablet PC, a set-top box (STB), a personal digital assistant (PDA), a mobile telephone, a smart phone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations. Machine 900 may be configured to be a sender, receiver, or other component of FIG. 1, implement one or more the components of FIGS. 2 and 8, one or more components of FIG. 3, and one or more of the methods of FIGS. 4-7.

Examples, as described herein, may include, or may operate on one or more logic units, components, or mechanisms (hereinafter "components"). Components are tangible entities (e.g., hardware) capable of performing specified operations and may be configured or arranged in a certain manner. In an example, circuits may be arranged (e.g., internally or with respect to external entities such as other circuits) in a specified manner as a component. In an example, the whole or part of one or more computer systems (e.g., a standalone, client or server computer system) or one or more hardware processors may be configured by firmware or software (e.g., instructions, an application portion, or an application) as a component that operates to perform specified operations. In an example, the software may reside on a machine readable medium. In an example, the software, when executed by the underlying hardware of the component, causes the hardware to perform the specified operations of the component.

Accordingly, the term "component" is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which component are temporarily configured, each of the components need not be instantiated at any one moment in time. For example, where the components comprise a general-purpose hardware processor configured using software, the general-purpose hardware processor may be configured as respective different components at different times. Software may accordingly configure a hardware processor, for example, to constitute a particular module at one instance of time and to constitute a different component at a different instance of time.

Machine (e.g., computer system) 900 may include one or more hardware processors, such as processor 902. Processor 902 may be a central processing unit (CPU), a graphics processing unit (GPU), a hardware processor core, or any combination thereof. Machine 900 may include a main memory 904 and a static memory 906, some or all of which may communicate with each other via an interlink (e.g., bus) 908. Examples of main memory 904 may include Synchronous Dynamic Random-Access Memory (SDRAM), such as Double Data Rate memory, such as DDR4 or DDR5. Interlink 908 may be one or more different types of interlinks such that one or more components may be connected using a first type of interlink and one or more components may be connected using a second type of interlink. Example interlinks may include a memory bus, a peripheral component interconnect (PCI), a peripheral component interconnect express (PCIe) bus, a universal serial bus (USB), or the like.

The machine 900 may further include a display unit 910, an alphanumeric input device 912 (e.g., a keyboard), and a user interface (UI) navigation device 914 (e.g., a mouse). In an example, the display unit 910, input device 912 and UI navigation device 914 may be a touch screen display. The machine 900 may additionally include a storage device (e.g., drive unit) 916, a signal generation device 918 (e.g., a speaker), a network interface device 920, and one or more sensors 921, such as a global positioning system (GPS) sensor, compass, accelerometer, or other sensor. The machine 900 may include an output controller 928, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 916 may include a machine readable medium 922 on which is stored one or more sets of data structures or instructions 924 (e.g., software) embodying or utilized by any one or more of the techniques or functions described herein. The instructions 924 may also reside, completely or at least partially, within the main memory 904, within static memory 906, or within the hardware processor 902 during execution thereof by the machine 900. In an example, one or any combination of the hardware processor 902, the main memory 904, the static memory 906, or the storage device 916 may constitute machine readable media.

While the machine readable medium 922 is illustrated as a single medium, the term "machine readable medium" may include a single medium or multiple media (e.g., a centralized or distributed database, and/or associated caches and servers) configured to store the one or more instructions 924.

The term "machine readable medium" may include any medium that is capable of storing, encoding, or carrying instructions for execution by the machine 900 and that cause the machine 900 to perform any one or more of the techniques of the present disclosure, or that is capable of storing, encoding or carrying data structures used by or associated with such instructions. Non-limiting machine readable medium examples may include solid-state memories, and optical and magnetic media. Specific examples of machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; Random Access Memory (RAM); Solid State Drives (SSD); and CD-ROM and DVD-ROM disks. In some examples, machine readable media may include non-transitory machine readable media. In some examples, machine readable media may include machine readable media that is not a transitory propagating signal.

The instructions 924 may further be transmitted or received over a communications network 926 using a transmission medium via the network interface device 920. The Machine 900 may communicate with one or more other machines wired or wirelessly utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks such as an Institute of Electrical and Electronics Engineers (IEEE) 802.11 family of standards known as Wi-Fi®, an IEEE 802.15.4 family of standards, a 5G New Radio (NR) family of standards, a Long Term Evolution (LTE) family of standards, a Universal Mobile Telecommunications System (UMTS) family of standards, peer-to-peer (P2P) networks, among others. In an example, the network interface device 920 may include one or more physical jacks (e.g., Ethernet, coaxial, or phone jacks) or one or more antennas to connect to the communications network 926. In an example, the network interface device 920 may include a plurality of antennas to wirelessly communicate using at least one of single-input multiple-output (SIMO), multiple-input multiple-output (MIMO), or multiple-input single-output (MISO) techniques. In some examples, the network interface device 920 may wirelessly communicate using Multiple User MIMO techniques.

Other Notes and Examples

Example 1 is a system for decoding multiplexed data from a signal, the system comprising: a receiver device, the receiver device comprising: a hardware processor; a memory, the memory including instructions, which when executed by the hardware processor, cause the hardware processor to perform operations comprising: receiving the signal; sampling the signal to produce a first portion of a first data stream and a first portion of a second data stream transmitted from first and second transmitters respectively; determining that a plurality of bit values of the first portion of the first data stream and the first portion of the second data stream cannot be determined; responsive to determining that the plurality of bit values of the first portion of the first data stream and the first portion of the second data stream cannot be determined: determining whether a number of bit values that cannot be determined exceeds a threshold; responsive to determining that the number of bit values that cannot be determined does not exceed the threshold: producing an output first portion of the first data stream from the first portion by using an erasure decoder to determine the plurality of bit values of the first portion of the first data stream that cannot be determined; responsive to determining that the number of bit values that cannot be decoded does exceed the threshold: producing the output first portion of the first data stream from the first portion by using a list decoder to determine the plurality of bit values of the first portion of the first data stream that cannot be determined; and outputting the output first portion of the first data stream.

In Example 2, the subject matter of Example 1 includes, wherein the threshold is based upon a Hamming distance between bits of the signal.

In Example 3, the subject matter of Examples 1-2 includes, wherein the erasure decoder is a Reed-Solomon decoder.

In Example 4, the subject matter of Examples 1-3 includes, wherein the operations of producing the output first portion of the first data stream from the first portion by using the list decoder to determine the plurality of bit values of the first portion of the first data stream that cannot be determined comprises: utilizing the list decoder to produce a plurality of possible bitstream portions from the first portion of the first data stream; utilizing an error and erasure decoder to decode each of the plurality of possible bitstream portions to produce a plurality of decoded possible bitstream portions; and selecting one of the plurality of decoded possible bitstream portions as the output first portion of the first data stream.

In Example 5, the subject matter of Examples 1-4 includes, wherein the operations of producing the output first portion of the first data stream from the first portion by using the list decoder to determine the plurality of bit values of the first portion of the first data stream that cannot be determined comprises: determining a type of media in the first portion of the first data stream; utilizing the list decoder to produce a plurality of possible bitstream portions from the first portion of the first data stream; and selecting one of the plurality of possible bitstream portions as the output first portion of the first data stream based upon the type of media.

In Example 6, the subject matter of Example 5 includes, wherein the operations of selecting one of the possible bitstream portions as the output first portion of the first data stream based upon the type of media comprises: using a media decoder to decode the plurality of possible bitstream portions and selecting the output first portion of the first data stream based upon results of the media decoding.

In Example 7, the subject matter of Examples 5-6 includes, wherein the operations of selecting one of the possible bitstream portions as the output first portion of the first data stream based upon the type of media in the first data stream comprises: using a media decoder to decode the plurality of possible bitstream portions and selecting the output first portion of the first data stream based upon a quality metric of the media decoding.

In Example 8, the subject matter of Examples 5-7 includes, wherein the operations of determining the type of media comprises using a machine-learned classification model.

In Example 9, the subject matter of Examples 1-8 includes, wherein the operations of receiving the signal comprises receiving an optical signal and wherein the operations of sampling the signal to produce a first portion of the first data stream and a first portion of the second data stream transmitted from the first and second transmitters respectively comprises: sampling a light detector for a plurality of samples; and determining bit values of the first and second data stream based upon a power level of light received at the light detector for each of the plurality of samples.

In Example 10, the subject matter of Examples 1-9 includes, wherein the operations of receiving the signal comprises receiving a radio-frequency signal.

Example 11 is a method for decoding multiplexed data from a signal, the method comprising: using a hardware processor: receiving the signal; sampling the signal to produce a first portion of a first data stream and a first portion of a second data stream transmitted from first and second transmitters respectively; determining that a plurality of bit values of the first portion of the first data stream and the first portion of the second data stream cannot be determined; responsive to determining that the plurality of bit values of the first portion of the first data stream and the first portion of the second data stream cannot be determined: determining whether a number of bit values that cannot be determined exceeds a threshold; responsive to determining that the number of bit values that cannot be determined does not exceed the threshold: producing an output first portion of the first data stream from the first portion by using an erasure decoder to determine the plurality of bit values of the first portion of the first data stream that cannot be determined; and outputting the output first portion of the first data stream; subsequent to outputting the first portion of the first data stream: sampling the signal to produce a second portion of the first data stream and a second portion of the second data stream; determining that a plurality of bit values of the second portion of the first data stream and the second portion of the second data stream cannot be determined: responsive to determining that a plurality of bit values of the second portion of the first data stream and the second portion of the second data stream cannot be determined, determining whether a second number of bit values that cannot be determined exceeds the threshold; responsive to determining that the second number of bit values that cannot be determined exceeds the threshold: producing an output second portion of the first data stream from the second portion by using a list decoder to determine the plurality of bit values of the second portion of the first data stream that cannot be determined; and outputting the output second portion of a first data stream.

In Example 12, the subject matter of Example 11 includes, wherein the threshold is based upon a Hamming distance between bits of the signal.

In Example 13, the subject matter of Examples 11-12 includes, wherein the erasure decoder is a Reed-Solomon decoder.

In Example 14, the subject matter of Examples 11-13 includes, wherein producing the output second portion of the first data stream from the second portion by using the list decoder to determine the plurality of bit values of the second portion of the first data stream that cannot be determined comprises: utilizing the list decoder to produce a plurality of possible bitstream portions from the second portion of the first data stream; utilizing an error and erasure decoder to decode each of the plurality of possible bitstream portions to produce a plurality of decoded possible bitstream portions; and selecting one of the plurality of decoded possible bitstream portions as the output second portion of the first data stream.

In Example 15, the subject matter of Examples 11-14 includes, wherein producing the output second portion of the first data stream from the second portion by using the list decoder to determine the plurality of bit values of the second portion of the first data stream that cannot be determined comprises: determining a type of media in the second portion of the first data stream; utilizing the list decoder to produce a plurality of possible bitstream portions from the second portion of the first data stream; and selecting one of the plurality of possible bitstream portions as the output second portion of the first data stream based upon the type of media.

In Example 16, the subject matter of Example 15 includes, wherein selecting one of the plurality of possible bitstream portions as the output second portion of the first data stream based upon the type of media comprises: using a media decoder to decode the plurality of possible bitstream portions and selecting the output first portion of the first data stream based upon results of the media decoding.

In Example 17, the subject matter of Examples 15-16 includes, wherein selecting one of the plurality of possible bitstream portions as the output second portion of the first data stream based upon the type of media comprises: using a media decoder to decode the plurality of possible bitstream portions and selecting the output second portion of the first data stream based upon a quality metric of the media decoding.

In Example 18, the subject matter of Examples 15-17 includes, wherein the operations of determining the type of media comprises using a machine-learned classification model.

In Example 19, the subject matter of Examples 11-18 includes, wherein receiving the signal comprises receiving an optical signal and wherein sampling the signal to produce a first portion of the first data stream and a first portion of the second data stream transmitted from the first and second transmitters respectively comprises: sampling a light detector for a plurality of samples; and determining bit values of the first and second data stream based upon a power level of light received at the light detector for each of the plurality of samples.

In Example 20, the subject matter of Examples 11-19 includes, wherein receiving the signal comprises receiving a radio-frequency signal.

Example 21 is a machine-readable storage medium, storing instructions for decoding multiplexed data from a signal, the instructions, which when executed by a machine, cause the machine to perform operations comprising: receiving the signal; sampling the signal to produce a first portion of a first data stream and a first portion of a second data stream transmitted from first and second transmitters respectively; determining that a plurality of bit values of the first portion of the first data stream and the first portion of the second data stream cannot be determined; responsive to determining that the plurality of bit values of the first portion of the first data stream and the first portion of the second data stream cannot be determined: determining whether a number of bit values that cannot be determined exceeds a threshold; responsive to determining that the number of bit values that cannot be determined does not exceed the threshold: producing an output first portion of the first data stream from the first portion by using an erasure decoder to determine the plurality of bit values of the first portion of the first data stream that cannot be determined; responsive to determining that the number of bit values that cannot be decoded does exceed the threshold: producing the output first portion of the first data stream from the first portion by using a list decoder to determine the plurality of bit values of the first portion of the first data stream that cannot be determined; and outputting the output first portion of the first data stream.

In Example 22, the subject matter of Example 21 includes, wherein the threshold is based upon a Hamming distance between bits of the signal.

In Example 23, the subject matter of Examples 21-22 includes, wherein the erasure decoder is a Reed-Solomon decoder.

In Example 24, the subject matter of Examples 21-23 includes, wherein the operations of producing the output first portion of the first data stream from the first portion by using the list decoder to determine the plurality of bit values of the first portion of the first data stream that cannot be determined comprises: utilizing the list decoder to produce a plurality of possible bitstream portions from the first portion of the first data stream; utilizing an error and erasure decoder to decode each of the plurality of possible bitstream portions to produce a plurality of decoded possible bitstream portions; and selecting one of the plurality of decoded possible bitstream portions as the output first portion of the first data stream.

In Example 25, the subject matter of Examples 21-24 includes, wherein the operations of producing the output first portion of the first data stream from the first portion by using the list decoder to determine the plurality of bit values of the first portion of the first data stream that cannot be determined comprises: determining a type of media in the first portion of the first data stream; utilizing the list decoder to produce a plurality of possible bitstream portions from the first portion of the first data stream: and selecting one of the plurality of possible bitstream portions as the output first portion of the first data stream based upon the type of media.

In Example 26, the subject matter of Example 25 includes, wherein the operations of selecting one of the possible bitstream portions as the output first portion of the first data stream based upon the type of media comprises: using a media decoder to decode the plurality of possible bitstream portions and selecting the output first portion of the first data stream based upon results of the media decoding.

In Example 27, the subject matter of Examples 25-26 includes, wherein the operations of selecting one of the possible bitstream portions as the output first portion of the first data stream based upon the type of media in the first data stream comprises: using a media decoder to decode the plurality of possible bitstream portions and selecting the output first portion of the first data stream based upon a quality metric of the media decoding.

In Example 28, the subject matter of Examples 25-27 includes, wherein the operations of determining the type of media comprises using a machine-learned classification model.

In Example 29, the subject matter of Examples 21-28 includes, wherein the operations of receiving the signal comprises receiving an optical signal and wherein the operations of sampling the signal to produce a first portion of the first data stream and a first portion of the second data stream transmitted from the first and second transmitters respectively comprises: sampling a light detector for a plurality of samples; and determining bit values of the first and second data stream based upon a power level of light received at the light detector for each of the plurality of samples.

In Example 30, the subject matter of Examples 21-29 includes, wherein the operations of receiving the signal comprises receiving a radio-frequency signal.

Example 31 is a device for decoding multiplexed data from a signal, the device comprising: means for receiving the signal; means for sampling the signal to produce a first portion of a first data stream and a first portion of a second data stream transmitted from first and second transmitters respectively; means for determining that a plurality of bit values of the first portion of the first data stream and the first portion of the second data stream cannot be determined; responsive to determining that the plurality of bit values of the first portion of the first data stream and the first portion of the second data stream cannot be determined: means for determining whether a number of bit values that cannot be determined exceeds a threshold; responsive to determining that the number of bit values that cannot be determined does not exceed the threshold: means for producing an output first portion of the first data stream from the first portion by using an erasure decoder to determine the plurality of bit values of the first portion of the first data stream that cannot be determined; responsive to determining that the number of bit values that cannot be decoded does exceed the threshold: means for producing the output first portion of the first data stream from the first portion by using a list decoder to determine the plurality of bit values of the first portion of the first data stream that cannot be determined; and means for outputting the output first portion of the first data stream.

In Example 32, the subject matter of Example 31 includes, wherein the threshold is based upon a Hamming distance between bits of the signal.

In Example 33, the subject matter of Examples 31-32 includes, wherein the erasure decoder is a Reed-Solomon decoder.

In Example 34, the subject matter of Examples 31-33 includes, wherein the means for producing the output first portion of the first data stream from the first portion by using the list decoder to determine the plurality of bit values of the first portion of the first data stream that cannot be determined comprises: means for utilizing the list decoder to produce a plurality of possible bitstream portions from the first portion of the first data stream; means for utilizing an error and erasure decoder to decode each of the plurality of possible bitstream portions to produce a plurality of decoded possible bitstream portions; and means for selecting one of the plurality of decoded possible bitstream portions as the output first portion of the first data stream.

In Example 35, the subject matter of Examples 31-34 includes, wherein the means for producing the output first portion of the first data stream from the first portion by using the list decoder to determine the plurality of bit values of the first portion of the first data stream that cannot be determined comprises: means for determining a type of media in the first portion of the first data stream; means for utilizing the list decoder to produce a plurality of possible bitstream portions from the first portion of the first data stream; and means for selecting one of the plurality of possible bitstream portions as the output first portion of the first data stream based upon the type of media.

In Example 36, the subject matter of Example 35 includes, wherein the means for selecting one of the possible bitstream portions as the output first portion of the first data stream based upon the type of media comprises: means for using a media decoder to decode the plurality of possible bitstream portions and selecting the output first portion of the first data stream based upon results of the media decoding.

In Example 37, the subject matter of Examples 35-36 includes, wherein the means for selecting one of the possible bitstream portions as the output first portion of the first data stream based upon the type of media in the first data stream comprises: means for using a media decoder to decode the plurality of possible bitstream portions and selecting the output first portion of the first data stream based upon a quality metric of the media decoding.

In Example 38, the subject matter of Examples 35-37 includes, wherein the means for determining the type of media comprises means for using a machine-learned classification model.

In Example 39, the subject matter of Examples 31-38 includes, wherein the means for receiving the signal comprises receiving an optical signal and wherein the means for sampling the signal to produce a first portion of the first data stream and a first portion of the second data stream transmitted from the first and second transmitters respectively comprises: means for sampling a light detector for a plurality of samples; and means for determining bit values of the first and second data stream based upon a power level of light received at the light detector for each of the plurality of samples.

In Example 40, the subject matter of Examples 31-39 includes, wherein the means for receiving the signal comprises receiving a radio-frequency signal.

Example 41 is at least one machine-readable medium including instructions that, when executed by processing circuitry, cause the processing circuitry to perform operations to implement of any of Examples 1-40.

Example 42 is an apparatus comprising means to implement of any of Examples 1-40.

Example 43 is a system to implement of any of Examples 1-40.

Example 44 is a method to implement of any of Examples 1-40.

What is claimed is:

1. A system for decoding multiplexed data from a signal, the system comprising: a receiver device, the receiver device comprising: a hardware processor; a memory, the memory including instructions, which when executed by the hardware processor, cause the hardware processor to perform operations comprising: receiving the signal; sampling the signal to produce a first portion of a first data stream and a first portion of a second data stream transmitted from first and second transmitters respectively; determining that a plurality of bit values of the first portion of the first data stream and the first portion of the second data stream cannot be determined; responsive to determining that the plurality of bit values of the first portion of the first data stream and the first portion of the second data stream cannot be determined: determining whether a number of bit values that cannot be determined exceeds a threshold; responsive to determining that the number of bit values that cannot be determined does not exceed the threshold: producing an output first portion of the first data stream from the first portion by using an erasure decoder to determine the plurality of bit values of the first portion of the first data stream that cannot be determined; responsive to determining that the number of bit values that cannot be determined does exceed the threshold: producing the output first portion of the first data stream from the first portion by using a list decoder to determine the plurality of bit values of the first portion of the first data stream that cannot be determined; and outputting the output first portion of the first data stream.

2. The system of claim 1, wherein the threshold is based upon a Hamming distance between bits of the signal.

3. The system of claim 1, wherein the erasure decoder is a Reed-Solomon decoder.

4. The system of claim 1, wherein the operations of producing the output first portion of the first data stream from the first portion by using the list decoder to determine the plurality of bit values of the first portion of the first data stream that cannot be determined comprises:
utilizing the list decoder to produce a plurality of possible bitstream portions from the first portion of the first data stream;
utilizing an error and erasure decoder to decode each of the plurality of possible bitstream portions to produce a plurality of decoded possible bitstream portions; and
selecting one of the plurality of decoded possible bitstream portions as the output first portion of the first data stream.

5. The system of claim 1, wherein the operations of producing the output first portion of the first data stream from the first portion by using the list decoder to determine the plurality of bit values of the first portion of the first data stream that cannot be determined comprises:
 determining a type of media in the first portion of the first data stream;
 utilizing the list decoder to produce a plurality of possible bitstream portions from the first portion of the first data stream; and
 selecting one of the plurality of possible bitstream portions as the output first portion of the first data stream based upon the type of media.

6. The system of claim 5, wherein the operations of selecting one of the possible bitstream portions as the output first portion of the first data stream based upon the type of media comprises:
 using a media decoder to decode the plurality of possible bitstream portions and selecting the output first portion of the first data stream based upon results of the media decoding.

7. The system of claim 5, wherein the operations of selecting one of the possible bitstream portions as the output first portion of the first data stream based upon the type of media in the first data stream comprises:
 using a media decoder to decode the plurality of possible bitstream portions and selecting the output first portion of the first data stream based upon a quality metric of the media decoding.

8. The system of claim 5 wherein the operations of determining the type of media comprises using a machine-learned classification model.

9. The system of claim 1, wherein the operations of receiving the signal comprises receiving an optical signal and wherein the operations of sampling the signal to produce a first portion of the first data stream and a first portion of the second data stream transmitted from the first and second transmitters respectively comprises:
 sampling a light detector for a plurality of samples; and
 determining bit values of the first and second data stream based upon a power level of light received at the light detector for each of the plurality of samples.

10. The system of claim 1, wherein the operations of receiving the signal comprises receiving a radio-frequency signal.

11. A machine-readable storage medium, storing instructions for decoding multiplexed data from a signal, the instructions, which when executed by a machine, cause the machine to perform operations comprising: receiving the signal; sampling the signal to produce a first portion of a first data stream and a first portion of a second data stream transmitted from first and second transmitters respectively; determining that a plurality of bit values of the first portion of the first data stream and the first portion of the second data stream cannot be determined; responsive to determining that the plurality of bit values of the first portion of the first data stream and the first portion of the second data stream cannot be determined: determining whether a number of bit values that cannot be determined exceeds a threshold; responsive to determining that the number of bit values that cannot be determined does not exceed the threshold: producing an output first portion of the first data stream from the first portion by using an erasure decoder to determine the plurality of bit values of the first portion of the first data stream that cannot be determined; responsive to determining that the number of bit values that cannot be determined does exceed the threshold: producing the output first portion of the first data stream from the first portion by using a list decoder to determine the plurality of bit values of the first portion of the first data stream that cannot be determined; and outputting the output first portion of the first data stream.

12. The machine-readable storage medium of claim 11, wherein the operations of producing the output first portion of the first data stream from the first portion by using the list decoder to determine the plurality of bit values of the first portion of the first data stream that cannot be determined comprises:
 utilizing the list decoder to produce a plurality of possible bitstream portions from the first portion of the first data stream;
 utilizing an error and erasure decoder to decode each of the plurality of possible bitstream portions to produce a plurality of decoded possible bitstream portions; and
 selecting one of the plurality of decoded possible bitstream portions as the output first portion of the first data stream.

13. The machine-readable storage medium of claim 11, wherein the operations of producing the output first portion of the first data stream from the first portion by using the list decoder to determine the plurality of bit values of the first portion of the first data stream that cannot be determined comprises:
 determining a type of media in the first portion of the first data stream;
 utilizing the list decoder to produce a plurality of possible bitstream portions from the first portion of the first data stream; and
 selecting one of the plurality of possible bitstream portions as the output first portion of the first data stream based upon the type of media.

14. The machine-readable storage medium of claim 13, wherein the operations of selecting one of the possible bitstream portions as the output first portion of the first data stream based upon the type of media comprises:
 using a media decoder to decode the plurality of possible bitstream portions and selecting the output first portion of the first data stream based upon results of the media decoding.

15. The machine-readable storage medium of claim 13, wherein the operations of selecting one of the possible bitstream portions as the output first portion of the first data stream based upon the type of media in the first data stream comprises:
 using a media decoder to decode the plurality of possible bitstream portions and selecting the output first portion of the first data stream based upon a quality metric of the media decoding.

16. The machine-readable storage medium of claim 11, wherein the operations of receiving the signal comprises receiving an optical signal and wherein the operations of sampling the signal to produce a first portion of the first data stream and a first portion of the second data stream transmitted from the first and second transmitters respectively comprises:
 sampling a light detector for a plurality of samples; and
 determining bit values of the first and second data stream based upon a power level of light received at the light detector for each of the plurality of samples.

17. A device for decoding multiplexed data from a signal, the device comprising: means for receiving the signal; means for sampling the signal to produce a first portion of a first data stream and a first portion of a second data stream transmitted from first and second transmitters respectively; means for determining that a plurality of bit values of the first portion of the first data stream and the first portion of the second data stream cannot be determined; responsive to determining that the plurality of bit values of the first portion of the first data stream and the first portion of the second data stream cannot be determined: means for determining whether a number of bit values that cannot be determined exceeds a threshold; responsive to determining that the number of bit values that cannot be determined does not exceed the threshold: means for producing an output first portion of the first data stream from the first portion by using an erasure decoder to determine the plurality of bit values of the first portion of the first data stream that cannot be determined; responsive to determining that the number of bit values that cannot be determined does exceed the threshold: means for producing the output first portion of the first data stream from the first portion by using a list decoder to determine the plurality of bit values of the first portion of the first data stream that cannot be determined; and means for outputting the output first portion of the first data stream.

18. The device of claim 17, wherein the means for producing the output first portion of the first data stream from the first portion by using the list decoder to determine the plurality of bit values of the first portion of the first data stream that cannot be determined comprises:

means for utilizing the list decoder to produce a plurality of possible bitstream portions from the first portion of the first data stream;

means for utilizing an error and erasure decoder to decode each of the plurality of possible bitstream portions to produce a plurality of decoded possible bitstream portions; and means for selecting one of the plurality of decoded possible bitstream portions as the output first portion of the first data stream.

19. The device of claim 17, wherein the means for producing the output first portion of the first data stream from the first portion by using the list decoder to determine the plurality of bit values of the first portion of the first data stream that cannot be determined comprises:

means for determining a type of media in the first portion of the first data stream;

means for utilizing the list decoder to produce a plurality of possible bitstream portions from the first portion of the first data stream; and means for selecting one of the plurality of possible bitstream portions as the output first portion of the first data stream based upon the type of media.

20. The device of claim 19, wherein the means for selecting one of the possible bitstream portions as the output first portion of the first data stream based upon the type of media comprises:

means for using a media decoder to decode the plurality of possible bitstream portions and selecting the output first portion of the first data stream based upon results of the media decoding.

\* \* \* \* \*